United States Patent [19]

Schilling et al.

[11] Patent Number: 4,764,734
[45] Date of Patent: Aug. 16, 1988

[54] CLASS SM POWER AMPLIFIER

[75] Inventors: Donald L. Schilling, Sands Port; David Manela, Kew Garden, both of N.Y.

[73] Assignee: SCS Telecom, Inc., Port Washington, N.Y.

[21] Appl. No.: 134,565

[22] Filed: Dec. 18, 1987

Related U.S. Application Data

[63] Continuation of Ser. No. 4,423, Jan. 20, 1987, abandoned.

[51] Int. Cl.$^4$ .......................... H03F 3/38; H03F 3/16
[52] U.S. Cl. ................................. 330/251; 330/277; 330/207 A
[58] Field of Search ............... 330/10, 51, 207 A, 251, 330/264, 277

[56] References Cited

U.S. PATENT DOCUMENTS

4,554,512  11/1985  Aiello ........................... 330/251 X
4,594,560  6/1986  Dingwall et al. ............... 330/277 X Primary Examiner—Eugene R. LaRoche
Assistant Examiner—Steven J. Mottola
Attorney, Agent, or Firm—David B. Newman, Jr.

[57] ABSTRACT

A class SM amplifier is provided having a threshold circuit with a plurality of threshold levels for generating a plurality of threshold signals. In response to an input signal passing a particular threshold level, the threshold circuit generates as an output a particular threshold signal. A voltage supply is provided having a plurality of voltage levels. The class SM amplifier includes a plurality of transistors coupled to a load and the threshold circuit, and the plurality of voltage levels from the voltage supply. The transistors switch a particular voltage level across the load in response to a particular threshold signal from the threshold circuit. The plurality of voltage levels are adjusted to approximate the input signal.

30 Claims, 5 Drawing Sheets

CLASS SM POWER AMPLIFIER

This is a continuation application of application Ser. No. 07/004,423, filed Jan. 10, 1987 now abandoned.

BACKGROUND OF THE INVENTION

This invention relates to amplifying signals at high frequency and at higher power, with minimal spectral pollution.

DESCRIPTION OF THE PRIOR ART

Figure 1A:
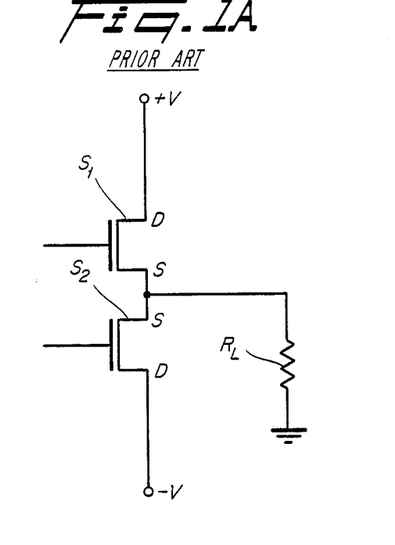
FIGS. 1A and 1B are block diagram of a prior art class D amplifier with a model of the class D amplifier as a switch.
Figure 1B:
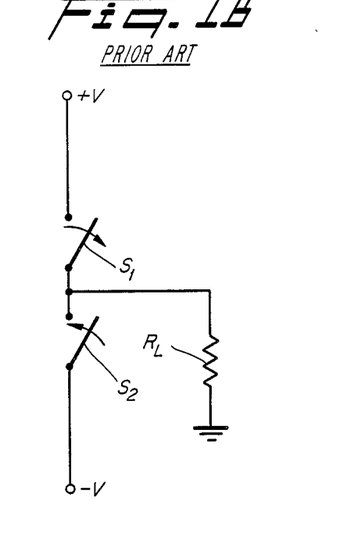
Figure 2:
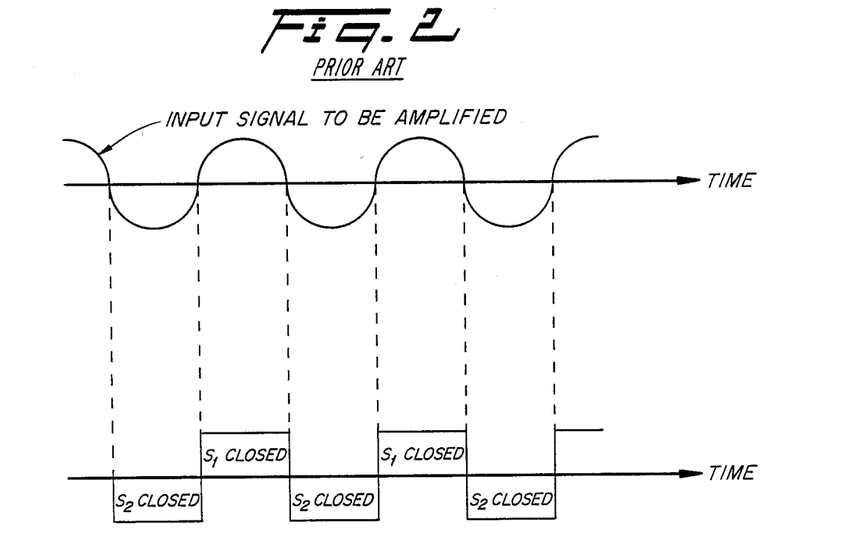
FIG. 2 illustrates an approximation of a sinusoid using a class D amplifier.

Class D amplifiers are well known in the prior art for amplifying signals at high power and high frequencies. As shown in FIG. 1a, the class D amplifier comprises two transistors, transistor $S_1$ and $S_2$. Transistors $S_1$ and $S_2$ may represent a group of transistors containing more than one transistor. In operation, the transistors in the class D amplifier are switched from saturation to cutoff. Each group of transistors acts like a switch as shown in FIG. 1b. When $S_1$ is closed, $S_2$ is open, and vice versa. The input signal to be amplified contains sufficient voltage to turn the transistors on and off. The resulting waveform presented to the load $R_L$ is shown in FIG. 2. Note that the input signal is a low power signal since the gate of a field effect transistor (FET), or the base of a bipolar junction transistor (BJT), accepts very low currents. As a result of the switching action of $S_1$ and $S_2$, the supply voltages, $+V$ and $-V$, are alternately switched across the load. If the switching is done instantaneously little power is dissipated in the transistors. The power which is dissipated in the transistors is due to the rise and fall times of the transistors, the input and output capacitance of the transistors which limit their switching speed, and also to the saturation resistance of the transistor switch which directly causes dissipation even when the transistor is saturated. These effects cannot be avoided.

In the prior art, there are two other fundamental problems with the class D amplifier configuration which are produced as a result of the square-wave nature of the output of the class D amplifier. First, the efficiency of the operation is poor since a significant portion of the signal is not at the desired frequency $f_o$ but is at harmonics of $f_o$. Thus, the power dissipated in the load $R_L$ due to the signal component at frequency $f_o$ is much less than the power supplied by the supply voltages. Second, the harmonics occur at the frequencies $2f_o$, $3f_o$ and all other harmonics of $f_o$, and these harmonics pollute the spectrum.

OBJECTS AND SUMMARY OF THE INVENTION

An object of the present invention is to provide an amplifier for operating at high frequencies and for delivering a high power to a load.

Another object of the present invention is to provide an amplifier having little power dissipation.

A further object of the present invention is to provide an amplifier having minimal spectral pollution.

According to the present invention, as embodied and broadly described herein, an apparatus for amplifying signals is provided comprising a load, an input source, and threshold means having more than one threshold level, for generating first, second, and third threshold signals, respectively. Also included are voltage means, and first, second, third, and fourth switching means coupled to the load, voltage means and threshold means. The threshold means, voltage means, and first, second, third and fourth switching means may be embodied as a threshold circuit, voltage supply, and a plurality of switching means including at least first, second, third, and fourth transistors, respectively. The input source can have an input signal with a bandwith and a center frequency. The threshold circuit is coupled to the input source. The voltage supply supplies first, second, third and fourth voltage levels to the first, second, third and fourth transistors, respectively. The first, second, third and fourth voltage levels normally are adjusted to approximate the input signal. Further, the first, second, third, and fourth transistors are responsive to the first, second, third and fourth threshold signals from threshold circuit for switching first, second, third, and fourth voltage levels across the load.

The invention also can be embodied as an apparatus, for amplifying an input signal, comprising a load, an input source having an input signal, threshold means for generating a timing sequence signal, voltage means, a plurality of switching means including at least first, second, third and fourth switching means coupled to the load, the voltage means and the threshold means. The threshold means, voltage means, and first, second, third and fourth switching means may be embodied as a threshold circuit, voltage supply, and first, second, third, and fourth transistors, respectively. In this embodiment, the threshold circuit is coupled to the input source and responsive to the input signal and generates a timing sequence signal having a plurality of timing intervals. The first, second, third and fourth transistors are responsive to the timing sequence signal of the threshold circuit for switching the first, second, third and fourth voltage levels, respectively, across the load.

Additional objects and advantages of the invention will be set forth in part in the description which follows, and in part will be obvious from the description, or may be learned by practice of the invention.

BRIEF DESCRIPTION OF THE DRAWINGS

The accompanying drawings, which are incorporated in and constitute a part of this specification, illustrate a preferred embodiment of the invention, and together with the description, serve to explain the principles of the invention.

DETAILED DESCRIPTION OF THE PREFERRED EMBODIMENTS

Reference will now be made in detail to the present preferred embodiments of the invention, examples of which are illustrated in the accompanying drawings.

Figure 3:
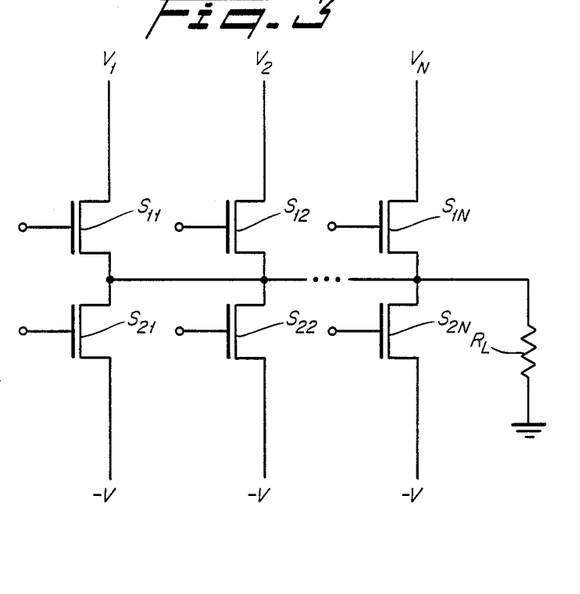
FIG. 3 is a schematic diagram of the class SM amplifier employing N transistors of the present invention.

FIG. 3 broadly illustrates the class SM amplifier. In this particular embodiment, the class SM amplifier comprises N groups of pairs of transistors. Each transistor, in each pair, may in practice contain K transistors in parallel, such that 2KN transistors are required. Also, 2N supply voltages are required.

Figure 4:
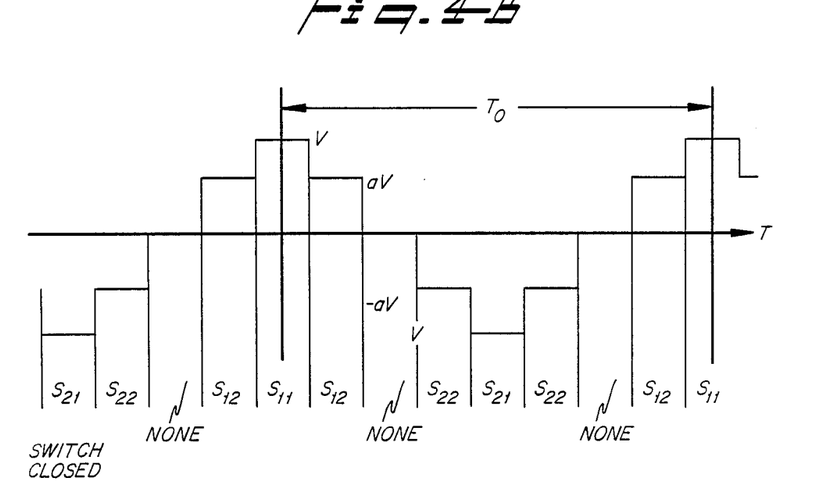
FIGS. 4A and 4B illustrate a particular transistor configuration of the class SM amplifier of the present invention, along with one approximation of a sinusoidal type signal such as one that is frequency modulated using the class SM amplifier.
Figure 4A:
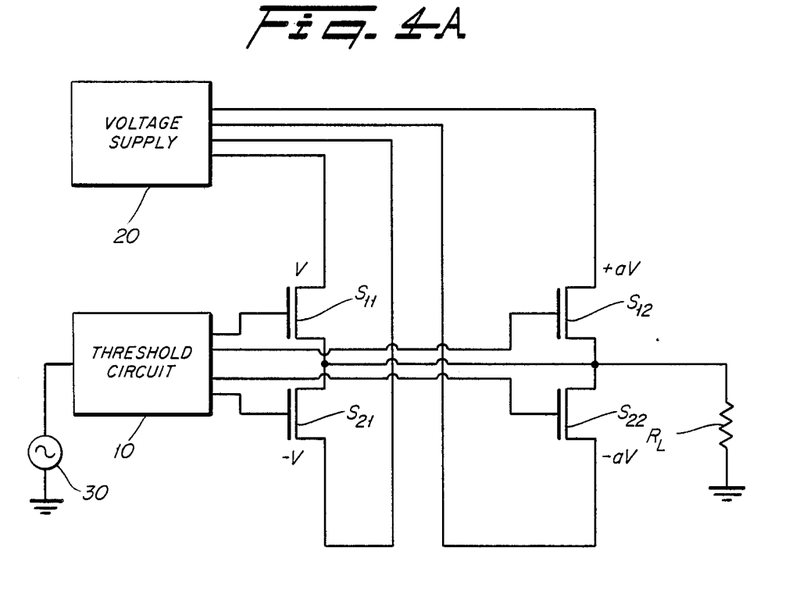

Referring to FIG. 4, a first preferred embodiment of a class SM amplifier is shown comprising a load, $R_L$, an input signal source 30, threshold means coupled to the input signal source 30 and voltage means for supplying a first voltage level, V, a second voltage level, aV, a third voltage level, $-aV$, and a fourth voltage level, $-V$. Also included are first, second, third and fourth switching means coupled to the threshold means. The threshold means may be embodied as threshold circuit 10. Voltage means may be embodied as voltage supply 20. First, second, third and fourth switching means may be embodied as first, second, third and fourth transistors $S_{11}$, $S_{12}$, $S_{22}$, $S_{21}$. The input signal source 30 supplies an input signal with a bandwidth B and a center frequency $f_o$. The input signal typically might be a frequency modulated, FM, or phase modulated, PM, signal.

The threshold circuit 10 includes first, second, third, and fourth threshold levels. In response to an input signal from the input source 30 crossing the first, second, third or fourth threshold level, the threshold circuit 10 generates first, second, third or fourth threshold signal, respectively.

The first transistor $S_{11}$ is coupled to the load $R_L$, the voltage supply 20, and the threshold circuit 10. The second transistor $S_{12}$ is coupled to the load $R_L$, the voltage supply 20, and the threshold circuit 10. The third transistor $S_{22}$ is coupled to the load $R_L$, the voltage supply 20, and the threshold circuit 10. The fourth transistor $S_{21}$ is coupled to the load $R_L$, the voltage supply 20, and the threshold circuit 10. In general, the first, second, third and fourth transistors $S_{11}$, $S_{12}$, $S_{22}$, $S_{21}$ need not be connected directly together. In FIG. 4, they are shown connected together since they all connect to $R_L$. In principle, however, they could be connected to filters and accordingly to each other through filters or other coupling mechanism.

The voltage supply 20 is coupled to the first, second, third and fourth transistors, $S_{11}$, $S_{12}$, $S_{22}$, $S_{21}$ and supplies a first voltage level, V, a second voltage level, aV, a third voltage level, $-aV$, and a fourth voltage level, $-V$ to the first, second, third and fourth transistors, $S_{11}$, $S_{12}$, $S_{22}$ and $S_{21}$. Voltage supply 20 continuously supplies voltage to the transistors. When a transistor is activated by having threshold circuit 10 apply voltage to, for example, a base or gate of a particular transistor, current flow through the transistor to the load.

First, second, third and fourth transistors $S_{11}$, $S_{12}$, $S_{22}$ and $S_{21}$ are responsive to the first, second, third and fourth threshold signals from threshold circuit 10, respectively. First, second, third and fourth threshold signals may be, for example, a voltage applied to the base or gate of a transistor.

Figure 5:
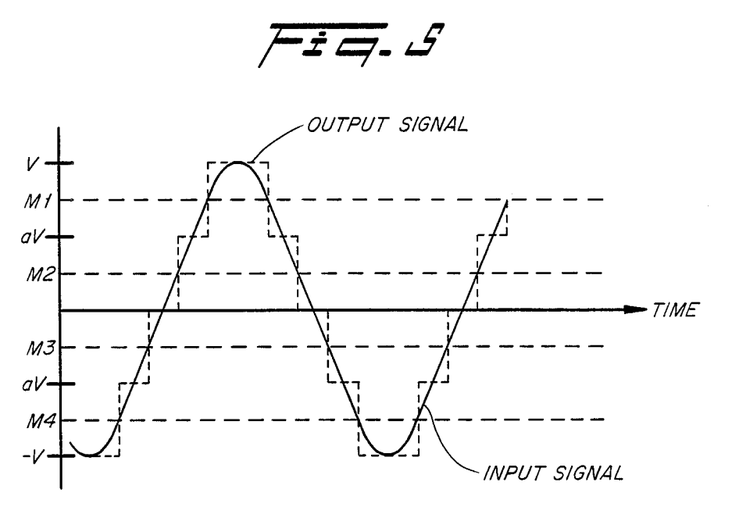
FIG. 5 shows an input signal having a sinusoidal waveform and output signal with respect to threshold levels.

FIG. 5 shows a particular relationship of the input signal, output signal, and first, second, third and fourth threshold levels. In response to the input signal from input source 30 being above first threshold level, M1, threshold circuit 10 generates the first threshold signal which activates first transistor $S_{11}$, thereby causing current to flow through first transistor $S_{11}$ and through load $R_L$. Accordingly, the first voltage level V appears across load $R_L$. In response to the input signal from input source 30 being above second threshold level, M2, and below first threshold level, M1, threshold circuit 10 generates the second threshold signal which activates second transistor $S_{12}$, thereby causing current to flow through second transistor $S_{12}$ and through load $R_L$. Accordingly, the second voltage level aV appears across load $R_L$. In response to an input signal from input source 30 being below third threshold level, M3, and above fourth threshold level, M4, threshold circuit 10 generates the third threshold signal which activates third transistor $S_{22}$, thereby causing current to flow through third transistor $S_{22}$ and through load $R_L$. Accordingly, the third voltage level $-aV$ appears across load $R_L$. In response to an input signal from input source 30 being below fourth threshold level, M4, threshold circuit 10 generates the fourth threshold signal which activates fourth transistor $S_{21}$, thereby causing current to flow through fourth transistor $S_{21}$ and through load $R_L$. Accordingly, the fourth voltage level $-V$ appears across load $R_L$. Thus, in response to first, second, third and fourth transistors $S_{11}$, $S_{12}$, $S_{22}$, $S_{21}$ being activated by threshold circuit 20, voltage supply 20 supplies a first voltage level, V, to the load $R_L$ via the first transistor $S_{11}$, a second voltage level, aV, to the load $R_L$ via the second transistor $S_{12}$, a third voltage level, $-aV$, to load $R_L$ via the third transistor $S_{22}$, and a fourth voltage level, $-V$, to load $R_L$ via the fourth transistor $S_{21}$. The first and fourth voltage levels, $\pm V$, and second and third voltage levels, $\pm aV$, may be adjusted to approximate the input signal.

In operation, the class SM amplifier uses first, second, third and fourth transistors $S_{11}$, $S_{12}$, $S_{22}$, and $S_{21}$, as switches to connect a prescribed voltage level across the load $R_L$ in response to the input signal being near a particular threshold level. The voltage levels for first, second, third and fourth transistors $S_{11}$, $S_{12}$, $S_{22}$, $S_{21}$ are each selected so that the resulting waveform across the load approximates the sinusoidal amplitude near the center frequency of the input signal.

As illustrated in FIG. 5, the threshold circuit 10 can have a fifth range for when the input signal from input source 30 is between second and third threshold levels, M2, M3, and threshold circuit 10 does not generate any threshold signal. In this range, no current flows through any of the transistors and load $R_L$. Accordingly, zero voltage appears across load $R_L$.

Figure 6A:
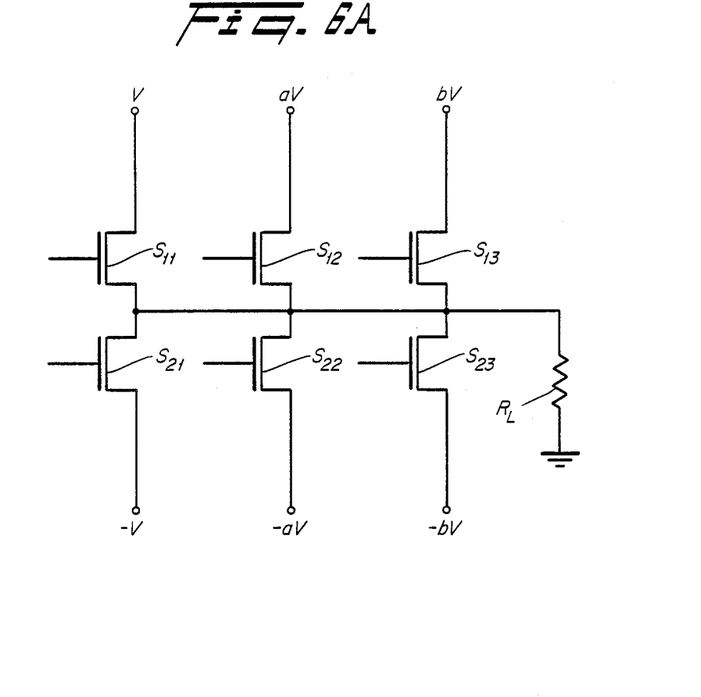
FIGS. 6A and 6B illustrate a second particular transistor configuration of the class SM amplifier of the present invention, along with a second approximation of a sinusoidal type signal using the class SM amplifier.

As shown in FIG. 6, the class SM amplifier may include a fifth and sixth transistor $S_{13}$, $S_{23}$. In this particular embodiment, voltage supply 20 would supply fifth and sixth voltage levels bV, $-bV$, to the fifth and sixth transistor $S_{13}$, $S_{23}$. Also, the threshold circuit 10 would have fifth and sixth threshold levels. Thus, in response to the input signal from input source 30 crossing the fifth threshold level, threshold circuit 10 generates the fifth threshold signal which activates fifth transistor $S_{13}$, thereby causing current to flow through fifth transistor $S_{13}$ and through load $R_L$. Accordingly, the fifth voltage level bV appears across load $R_L$. In response to the input signal from input source 30 crossing the sixth threshold level, threshold circuit 10 generates the sixth threshold signal which activates sixth transistor $S_{23}$, thereby causing current to flow through six transistor $S_{23}$ and through load $R_L$. Accordingly, the sixth voltage level $-bV$ appears across load $R_L$.

A second preferred embodiment of the class SM amplifier may include having threshold means embodied as threshold circuit 10 for generating a timing sequence signal. For this particular embodiment, threshold circuit 10 generates a timing sequence signal having first, second, third and fourth timing intervals in response to measuring the period of the input signal from signal source 30 by threshold circuit 10. This period, in general, will change from cycle to cycle. Threshold circuit 10 divides the $n^{th}$ period, $P_n$, into N equal timing intervals, each having duration $T_n = P_n/N$. The $T_n$ may be different for each period $P_n$.

In the second embodiment of the instant invention, input source 30 supplies an input signal having a center frequency $f_o$ and a bandwidth B. Threshold circuit 10 is coupled to the input source 30 and generates a timing sequence signal having first, second, third and fourth timing intervals. During the first timing interval, and in response to the timing sequence signal, first transistor $S_{11}$ is activated and current flows through first transistor $S_{11}$ and through load $R_L$. Accordingly, the first voltage level appears across load $R_L$. During the second timing interval, and in response to the timing sequence signal, second transistor $S_{12}$ is activated and current flows through second transistor $S_{12}$ and through load $R_L$. Accordingly, the second voltage level appears across load $R_L$. During the third timing interval, and in response to the timing sequence signal, third transistor $S_{22}$ is activated and current flows through third transistor $S_{22}$ and through load $R_L$. Accordingly, the third voltage level appears across load $R_L$. During the fourth timing interval, and in response to the timing sequence signal, fourth transistor $S_{21}$ is activated and current flows through fourth transistor $S_{21}$ and through load $R_L$. Accordingly, the fourth voltage level appears across load $R_L$.

Figure 6B:
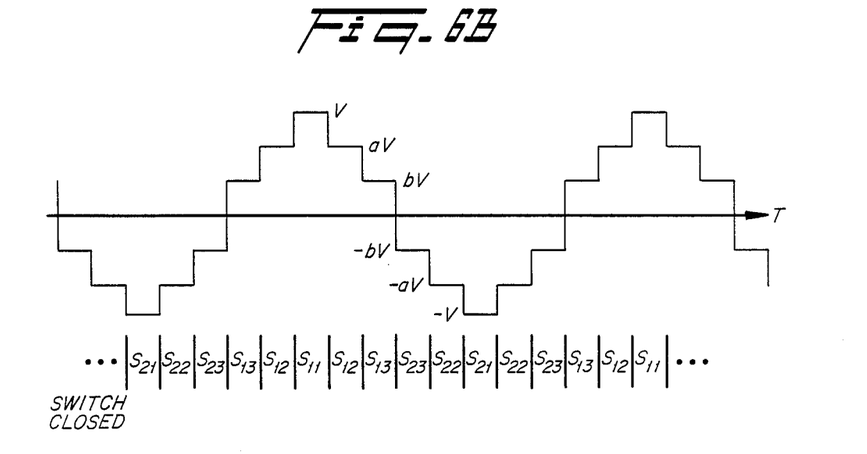

Additional timing intervals may be included as shown in FIG. 6b in this particular embodiment during which no voltage is applied to the first, second, third and fourth transistors, $S_{11}$, $S_{12}$, $S_{22}$, $S_{21}$. Further, timing circuits may supply the timing sequence signal to the transistors to produce an approximation of a sinusoidal amplitude using the class SM amplifier of the invention, as illustrated in FIG. 6b.

As illustratively shown in FIG. 6, first, second, third, fourth, fifth, and sixth transistors may be configured along with corresponding first, second, third, fourth, fifth and sixth voltages V, aV, bV, $-bV$, $-aV$, and $-V$. This embodiment may be employed to generate an improved approximation of a sinusoidal type signal as shown in FIG. 6b. Further, additional transistors may be configured as was shown in FIG. 3 to even further improve the sinusoidal amplitude approximation.

In operation, the class SM amplifier is required to deliver an approximation sinusoidal current to the load. The closer the current resembles the input signal the smaller will be the amplitude of the signals at the harmonic frequencies in the frequency domain and the higher the amplifier efficiency becomes. Simultaneously, since each transistor operates as a switch, the power dissipation is minimized and is the same as for a class D amplifier. Accordingly, the class SM amplifier dissipates power similar to the class D amplifier; however, the class SM amplifier operates at significantly higher efficiency.

Figure 7:
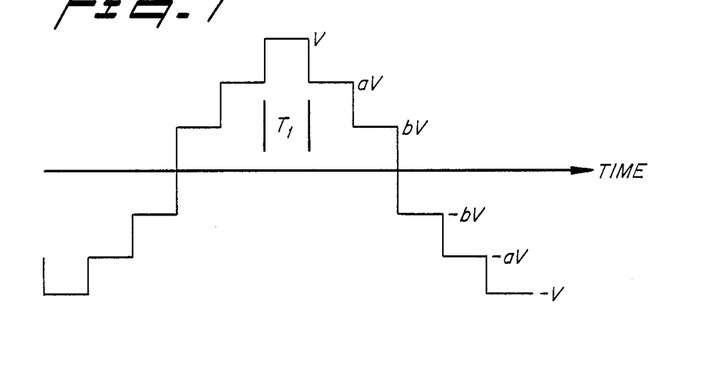
FIG. 7 illustrates how voltage and time both can be varied to approximate the sinusoidal type waveform.

For the class SM amplifier in FIG. 3, the voltages $\pm V_1, \pm V_2, \ldots, \pm V_N$ and/or the durations of the interval during which a transistor is closed are set such that the net current into the load $R_L$ approximates a sinusoidal amplitude. FIGS. 4, 6, and 7 illustrate typical class SM amplifier approximations to the input signal having a sinusoidal amplitude. FIG. 4a shows voltages $\pm V$ and $\pm aV$. The factor a is adjusted suitably to approximate a sinewave. While an "optimum" a can be found to maximize efficiency, suboptimum values also can be used. FIG. 4b shows the approximation to the sinewave as first, second, third, and fourth transistors $S_{11}$, $S_{12}$, $S_{22}$, and $S_{21}$ are closed as a switch. In this particular embodiment, there are two intervals during which no switch is closed. Also, the duration of each interval is fixed. FIG. 6 is similar to FIG. 4; however, six voltage levels are supplied from the voltage supply. FIG. 7 shows that time duration and/or a voltage can be varied from that of FIG. 6a, to approximate the sinusoidal waveform. It is noted, however, that no one switch need always be closed during the timed intervals.

In the present invention it is important to approximate the input signal to provide efficient amplification and low spectral splatter in the output across load $R_L$. This can be accomplished by changing the duration and/or voltage, and how many voltages/time durations are used. Increasing the number of voltages, i.e., letting N increase in FIG. 3 and "optimally" adjusting the supply voltages will result in improved performance, achieving maximum efficiency.

Figure 8:
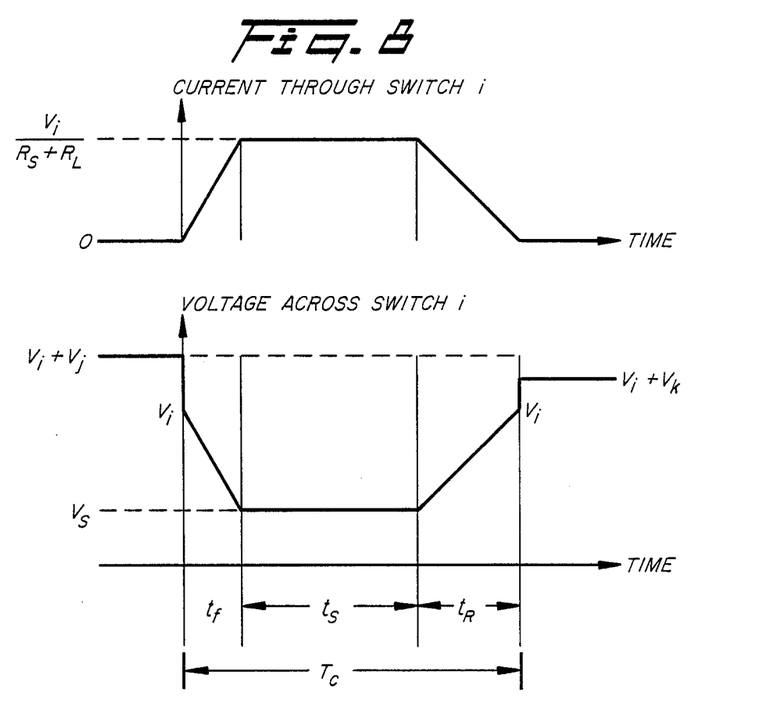
FIG. 8 illustrates voltage and current relationships of a transistor switch.

The design of such an amplifier can be accomplished as follows:

Assume that the voltage and current relationship of a switch can be modelled as shown in FIG. 8. Assume that when a transistor acting as a switch is closed, the transistor can be represented by a resistance $R_s$. Then the current through the transistor-switch is $$I_s = V_i/(R_s + R_L) \tag{1}$$

and the voltage across the switch is $$V_s = V_i R_s/(R_s + R_L) \tag{2}$$

When the transistor switch opens, the effective time for the voltage to increase and the current to decrease is $t_R$; when the switch closes, the effective time for the voltage to decrease and the current to increase is $t_f$. When the transistor-switch is open, the current through it is zero and the voltage across the switch is $V_i + V_m$ where $V_m$ is the voltage across the load placed there by transistor-switch $S_M$.

For ease of calculation assume the rise and fall times and voltage and current waveforms are linear as shown. Further, assume that the signal to be amplified is sinusoidal. For this case, the average power dissipated in the switch which is "closed" for a time $T_c = t_f + t_s + t_r$ during the period $T_o = 1/f_o$ is $P_{D1}$ where, $$P_{D1} = P_f + P_s + P_r \tag{3}$$

where $$P_f = \frac{t_f}{T_o} \frac{V_i^2}{6(R_s + R_L)} \tag{4a}$$

-continued $$P_s = \frac{t_s}{T_o} \cdot \frac{V_i^2 R_s}{(R_s + R_L)^2} \quad (4b)$$

and $$P_r = \frac{t_r}{T_o} \cdot \frac{V_i^2}{6(R_s + R_L)} \quad (4c)$$

and $V_i >> V_s = V_i R_s/(R_s + R_L)$, i.e., $R_L >> R_s$ for efficient operation. Thus $$P_{D1} = \frac{1}{T_o} \left( \frac{V_i^2}{R_s + R_L} \right) \left[ t_s \frac{R_s}{R_s + R_L} + \frac{t_r + t_f}{6} \right] \quad (5a)$$

There are approximately 4N switching operations occurring each period $T_0$ to form the sinusoidal signal. The total power dissipated in all of the transistor-switches for M switching operations occuring each period $T_o$ is $$P_{DT} = \sum_{i=1}^{4N} P_{D1} = \quad (5b)$$

$$\frac{4N}{2T_o} \left( \frac{V_p^2}{R_s + R_L} \right) \left[ t_s \frac{R_s}{R_s + R_L} + \frac{t_r + t_f}{6} \right]$$

since $\sum_{i=1}^{4N} V_i^2 = 4N \frac{V_p^2}{2}$.

and $V_p$ is the largest value of the 2N voltages called $V_i$, i.e., $V_{i,max} = V_p$. Furthermore, if the sinusoidal signal is represented by 4N segments, the waveform across the load contains the fundamental frequency $f_o$, and signals at the frequencies $4Nf_o$, $8Nf_o$... The power dissipated in the load due to the fundamental frequency $f_o$ is $$P_o = \frac{V_p^2}{2R_L} \left( \frac{\sin\pi/4N}{\pi/4N} \right)^2 \approx \frac{V_p^2}{2R_L} \quad \begin{array}{l} N \geq 1 \\ M \geq 2 \end{array} \quad (6)$$

The power dissipated in the load due to the harmonics can be shown to be approximately equal to $$P_H = 0.375 \, V_p^2/8N^2 R_L \quad \begin{array}{l} N \geq 1 \\ M \geq 2 \end{array} \quad (7)$$

Since $N=1$, and $M=1$ corresponds to a class D amplifier, we are interested only in values of $N \geq 1$ and $M \geq 2$ for which equations 6 and 7 apply.

Equation 6 neglected all losses in the tranistor-switch, thereby assuming ideal operation. Including the losses in the switches (see equation 5b), the power dissipated in the load is $P_L$ where $$P_L = \frac{V_p^2}{2R_L} - N \left( \frac{V_p^2}{R_s + R_L} \right) \left[ \frac{t_s}{T_o} \cdot \frac{R_s}{R_s + R_L} + \frac{t_r + t_f}{6T_o} \right] \quad (8)$$

Efficiency
The efficiency, E, of this amplifier is $$E = \frac{P_L}{P_{supply}} = \frac{P_L}{P_L + P_{DT} + P_H} \quad (9)$$

Figure of Merit, F
The Figure of Merit F of an amplifier is defined as $$F = \frac{P_L}{P_{DT}} \approx \frac{1}{2N \left[ \frac{t_s}{T_o} \left( \frac{R_s}{R_L} \right) + \frac{t_r + t_f}{6T_o} \right]} \quad (10)$$

where we have assumed $R_s << R_L$ and $F >> 1$.

EXAMPLE

Referring to FIG. 4, $R_s = 0.5$, $R_L = 50$, $f_o = 10$ MHz, $T_o = 100$ ns, $4N = 8$, $t_s + t_f = 5$ ns, $V_p = 100$ V.
In this case:

$$P_o = \frac{V_p^2}{2R_L} = 100 \, W$$

To calculate $P_{DT}$ we need $t_s$. Since $T_c = T_o/N = 100$ us/8 = 12.5 ns, we have $t_s = 7.5$ ns. Thus $$P_{DT} = 8(100) \left[ \frac{7.5}{100}(0.1) + \frac{5}{600} \right] = 6 + 7 = 13 \, W$$

The Harmonic Distortion is $$P_H = \frac{0.375}{64}(100) \approx 0.6 \, W$$

showing very low harmonic distortion, i.e. $\approx 23$dB below the output.
Efficiency
The efficiency of this class SM amplifier is $$E = \frac{100}{113.6} \approx 88\%$$

Note that if 8 transistors were used the average power dissipated per transistor would be less than 2 W.

From the teachings of the present invention, it would be obvious that variations and extensions can be made from the claimed invention. For example, in a preferred embodiment, the number of transistors per switching element can be increased to handle increased power. Further, the total number of power supply voltages may be adjusted to improve the approximation of the input signal.

It will be apparent to those skilled in the art various modifications can be made to the SM amplifier of the instant invention without departing from the scope or spirit of the invention, and it is intended that the present invention cover modifications and variations of the class SM amplifier provided they come within the scope of the appended claims and their equivalence.

We claim:
1. A class SM amplifier comprising:
   a load;
   an input source having an input signal with a bandwidth B and a center frequency $f_o$;
   threshold means having first, second, third and fourth threshold levels, and coupled to said input source and responsive to the voltage amplitude of the input signal crossing first, second, third and fourth threshold levels, for generating first, second, third, and fourth threshold signals, respectively;

voltage means for supplying a first voltage level, V, a second voltage level, aV, a third voltage level, $-aV$, and a fourth voltage level, $-V$, wherein first voltage level is adjusted to approximate the voltage amplitude of the input signal when the voltage amplitude of the input signal crosses the first threshold level, second voltage level is adjusted to approximate the voltage amplitude of the input signal when the voltage amplitude of the input signal crosses the second threshold level, third voltage level is adjusted to approximate the voltage amplitude of the input signal when the voltage amplitude of the input signal crosses the third threshold level, and fourth voltage level is adjusted to approximate the voltage amplitude of the input signal when the voltage amplitude of the input signal crosses the fourth threshold level;

first switching means coupled to said load, said threshold means and the first voltage level of said voltage means, and responsive to the first threshold signal from said threshold means for switching the first voltage level across said load;

second switching means coupled to said load, said threshold means and the second voltage level of said voltage means, and responsive to the second threshold signal from said threshold means for switching the second voltage level across said load;

third switching means coupled to said load, said threshold means and the third voltage level of said voltage means, and responsive to the third threshold signal from said threshold means for switching the third voltage level across said load; and fourth switching means coupled to said load, said threshold means and the fourth voltage level of said voltage means, and responsive to the fourth threshold signal from said threshold means for switching the fourth voltage level across said load.

2. A class SM amplifier comprising:

a load;

an input source having an input signal with a bandwidth and a center frequency;

threshold means having a plurality of threshold levels including at least first, second, third and fourth threshold levels, and coupled to said input source, and responsive to the voltage amplitude of the input signal crossing first, second, third and fourth threshold levels, for generating first, second, third and fourth threshold signals, respectively;

voltage means for supplying a plurality of voltage levels including at least first, second, third and fourth voltage levels, wherein first voltage level is adjusted to approximate the voltage amplitude of the input signal when the voltage amplitude of the input signal crosses the first threshold level, second voltage level is adjusted to approximate the voltage amplitude of the input signal when the voltage amplitude of the input signal crosses the second threshold level, third voltage level is adjusted to approximate the voltage amplitude of the input signal when the voltage amplitude of the input signal crosses the third threshold level, and fourth voltage level is adjusted to approximate the voltage amplitude of the input signal when the voltage amplitude of the input signal crosses the fourth threshold level;

a plurality of switching means including at least first, second, third, and fourth switching means coupled to said load, said threshold means, and to the first, second, third and fourth voltage levels of said voltage means, respectively; and wherein said first, second, third, and fourth switching means are responsive to the first, second, third and fourth respective threshold signals from said threshold means for switching first, second, third and fourth voltage levels of said voltage means, respectively, across said load.

3. A class SM amplifier comprising:

a load;

an input source having an input signal with a bandwidth and a center frequency;

threshold means having a plurality of threshold levels including first and second threshold levels, coupled to said input source and responsive to the voltage amplitude of the input signal for generating a plurality of threshold signals including first and second threshold signals;

voltage means for supplying a plurality of voltage levels including first, second and third voltage levels, wherein first voltage level is adjusted to approximate the voltage amplitude of the input signal when the voltage amplitude of the input signal crosses the first threshold level, and second voltage level is adjusted to approximate the voltage amplitude of the input signal when the voltage amplitude of the input signal crosses the second threshold level; and a plurality of switching means, including first and second switching means, coupled to said load, said threshold means and the plurality of voltage levels of said voltage means wherein said first and second switching means are responsive to the first and second threshold signals for switching the first and second voltage levels, respectively, across said load.

4. A class SM amplifier comprising:

a load;

an input source having an input signal with a bandwidth and a center frequency;

threshold means coupled to said input source and responsive to the input signal, for generating a timing sequence signal having first, second, third, and fourth timing intervals;

voltage means for supplying a first voltage level, V, a second voltage level, aV, a third voltage level, $-aV$, and a fourth voltage level, $-V$, wherein first voltage level is adjusted to approximate the voltage amplitude of the input signal during the first timing interval, second voltage level is adjusted to approximate the voltage amplitude of the input signal during the second timing interval, third voltage level is adjusted to approximate the voltage amplitude of the input signal during the third timing interval, and fourth voltage level is adjusted to approximate the voltage amplitude of the input signal during the fourth timing interval;

first switching means coupled to said load, said threshold means and the first voltage level of said voltage means, and responsive to the timing sequence signal from said threshold means for switching the first voltage level across said load during the first timing interval;

second switching means coupled to said load, said threshold means and the second voltage level of said voltage means, and responsive to the timing sequence signal from said threshold means for switching the second voltage level across said load during the second timing interval;

third switching means coupled to said load, said threshold means and the third voltage level of said voltage means, and responsive to the timing sequence signal from said threshold means for switching the third voltage level across said load during the third timing interval; and fourth switching means coupled to said load, said threshold means and the fourth voltage level of said voltage means, and responsive to the timing sequence signal from said threshold means for switching the fourth voltage level across said load during the fourth timing interval.

5. A class SM amplifier comprising:

a load;

an input source having an input signal with a bandwidth and center frequency;

threshold means coupled to said input source, and responsive to the input signal for generating a timing sequence signal having a plurality of timing intervals including at least first, second, third and fourth timing intervals;

voltage means for supplying a plurality of voltage levels including at least first, second, third and fourth voltage levels, wherein first voltage level is adjusted to approximate the voltage amplitude of the input signal during the first timing interval, second voltage level is adjusted to approximate the voltage amplitude of the input signal during the second timing interval, third voltage level is adjusted to approximate the voltage amplitude of the input signal during the third timing interval, and fourth voltage level is adjusted to approximate the voltage amplitude of the input signal during the fourth timing interval;

a plurality of switching means including at least first, second, third, and fourth switching means coupled to said load, said threshold means, and to the first, second, third and fourth voltage levels of said voltage means, respectively; and wherein said first, second, third and fourth switching means are responsive to the timing sequence signal from said threshold means for switching the first, second, third and fourth respective voltage levels across said load during the first, second, third and fourth timing intervals, respectively.

6. A class SM amplifier comprising:

a load;

an input source having an input signal with a bandwidth and a center frequency;

threshold means coupled to said input source and responsive to the input signal for generating a timing sequence signal having a plurality of timing intervals including first, second, and third timing intervals;

voltage means for supplying a plurality of voltage levels including at least first, second, and third voltage levels, wherein the voltage levels are adjusted to approximate voltage amplitude of the input signal, during the first, second, and third timing intervals, respectively; and a plurality of switching means including at least first, and second switching means, coupled to said load, said threshold means, and the first, and second voltage levels of said voltage means, respectively, wherein said first and second switching means are responsive to the timing sequence signal of said threshold means for switching the first and second voltage levels across said load during the first and second timing intervals, respectively.

7. The class SM amplifier as set forth in claim 1, further including:

threshold means having fifth and sixth threshold levels, and responsive to the input signal crossing fifth and sixth threshold levels, for generating fifth and sixth threshold signals, respectively;

voltage means for supplying a fifth voltage level, bV, and a sixth voltage level, $-bV$, wherein fifth and sixth voltage levels are adjusted to approximate the voltage amplitude of the input signal, proximately as the input signal crosses fifth and sixth threshold levels, respectively;

fifth switching means coupled to said load, said threshold means and the fifth voltage level of said voltage means, and responsive to the fifth threshold signal from said threshold means for switching the fifth voltage level across said load;

sixth switching means coupled to said load, said threshold means and the sixth voltage level of said voltage means, and responsive to the sixth threshold signal from said threshold means for switching the sixth voltage level across said load; and wherein first and fourth voltage levels, $\pm V$, second and third voltage levels, $\pm aV$, and fifth and sixth voltage levels, $\pm bV$, are adjusted to increase efficiency of said class SM amplifier by having a significant portion of the input signal amplified within the bandwidth B at center frequency $f_o$ and by having minimal spectral pollution of the input signal amplified outside the bandwidth B and at harmonics of the center frequency $f_o$.

8. The class SM amplifier as set forth in claim 4, further including:

threshold means responsive to the input signal for generating fifth and sixth timing intervals of the timing sequence signal, respectively;

voltage means for supplying a fifth voltage level, bV, and a sixth voltage level, $-bV$, wherein fifth and sixth voltage levels are adjusted to approximate the voltage amplitude of the input signal, proximately as the input signal crosses the fifth and sixth threshold levels, respectively;

fifth switching means coupled to said load, said threshold means and the fifth voltage level of said voltage means, and responsive to the timing sequence signal from said threshold means for switching the fifth voltage level across said load during the fifth timing interval;

sixth switching means coupled to said load, said threshold means and the sixth voltage level of said voltage means, and responsive to the timing sequence signal from said threshold means for switching the sixth voltage level across said load during the sixth timing interval; and wherein first and fourth voltage levels, $\pm V$, second and third voltage levels, $\pm aV$, and fifth and sixth voltage levels, $\pm bV$, are adjusted to increase efficiency of said class SM amplifier by having a significant portion of the input signal amplified within the bandwidth B at center frequency $f_o$ and by having minimal spectral pollution of the input signal amplified outside the bandwidth B and at harmonics of the center frequency $f_o$.

9. The class SM amplifier as set forth in claim 1, 2, 3, 4, 5, or 6, wherein said first, second, third, and fourth switching means each include at least one transistor.

10. The class SM amplifier as set forth in claim 1, 2, or 3, wherein said threshold means includes a threshold circuit.

11. The class SM amplifier as set forth in claim 4, 5, or 6, wherein said threshold means includes a timing circuit.

12. A class SM amplifier comprising:
a load;
an input source having an input signal with a bandwidth and a center frequency;
threshold means having at least first and second threshold levels, and coupled to said input source and responsive to voltage amplitude of the input signal crossing first and second threshold levels, for generating first and second threshold signals, respectively;
voltage means for supplying at least a first voltage level, a second voltage level, and a third voltage level, wherein first voltage level is adjusted to approximate the voltage amplitude of the input signal when the voltage amplitude of the input signal is above first threshold level, second voltage level is adjusted to approximate the voltage amplitude of the input signal when the voltage amplitude of the input signal is below the second threshold level, and third voltage level is adjusted to approximate the voltage amplitude of the input signal when the voltage amplitude of the input signal is between the first and second threshold levels; and
a plurality of switching means including first and second switching means, coupled to said load, said threshold means and the first and second voltage levels of said voltage means with said first and second switching means coupled respectively to the first and second voltage levels of said voltage means, and responsive to the first and second threshold signals for switching the first and second voltage levels, respectively, across said load.

13. A class SM amplifier comprising:
a load;
an input source having an input signal with a bandwidth and a center frequency;
threshold means coupled to said input source and responsive to the input signal, for generating a timing sequence having at least first, second, and third timing intervals;
voltage means for supplying at least a first voltage level, a second voltage level, and a third voltage level, wherein first voltage level is adjusted to approximate the voltage amplitude of the input signal during the first timing interval, second voltage level is adjusted to approximate the voltage amplitude of the input signal during the second timing interval, and third voltage level is adjusted to approximate the voltage amplitude of the input signal during the third timing interval; and
a plurality of switching means coupled to said load, said threshold means and the first, second and third voltage levels of said voltage means, and responsive to the timing sequence for switching the first, second and third voltage levels during the first, second, and third timing intervals, respectively, across said load.

14. The class SM amplifier as set forth in claims 1, 2, 3, 4, 5, 6, or 8 wherein only one switching means in closed at a time.

15. A class SM amplifier comprising:
a load;
an input source having an input signal with a bandwidth B and a center frequency $f_o$;
threshold means having at least first and second threshold levels, and coupled to said input source and responsive to the voltage amplitude of the input signal crossing first and second threshold levels, for generating first and second threshold signals, respectively;
voltage means for supplying at least a first voltage level, a second voltage level, and a third voltage level, wherein first voltage level is adjusted to approximate the voltage amplitude of the input signal when the voltage amplitude of the input signal is above the first threshold level, second voltage level is adjusted to approximate the voltage amplitude of the input signal when the voltage amplitude of the input signal is below the second threshold level, and third voltage level is adjusted to approximate the voltage amplitude of the input signal when the voltage amplitude of the input signal is between the first and second threshold levels;
first switching means coupled to said load, said threshold means and the first voltage level of said voltage means, and responsive to the first threshold signal from said threshold means for switching the first voltage level across said load; and
second switching means coupled to said load, said threshold means and the second voltage level of said voltage means, and responsive to the second threshold signal from said threshold means for switching the second voltage level across said load.

16. The class SM amplifier as set forth in claim 15, further having said threshold means responsive to when the voltage amplitude of the input signal is between the first threshold level and the second threshold level, for generating a third threshold signal; and
third switching means coupled to said load, said threshold means and the third voltage level of said voltage means, and responsive to the third threshold signal from said threshold means for switching the third voltage level across said load.

17. A class SM amplifier comprising:
a load;
an input source having an input signal with a bandwidth B and a center frequency $f_o$;
threshold means having at least first, second, third and fourth threshold levels, and coupled to said input source and responsive to the voltage amplitude of the input signal crossing first, second, third and fourth threshold levels, for generating first, second, third and fourth threshold signals, respectively;
voltage means for supplying at least a first voltage level, a second voltage level, a third voltage level, a fourth voltage level, and a fifth voltage level, wherein first voltage level is adjusted to approximate the voltage amplitude of the input signal when the voltage amplitude of the input signal is above the first threshold level, second voltage level is adjusted to approximate the voltage amplitude of the input signal when the voltage amplitude of the input signal is between the first threshold level and the second threshold level, third voltage level is adjusted to approximate the voltage amplitude of the input signal when the voltage amplitude of the input signal is between the third threshold level and the fourth threshold level, fourth voltage level is adjusted to approximate the voltage amplitude of the input signal when the voltage amplitude of the input signal is below the fourth threshold level, and fifth voltage level is adjusted to approximate the voltage amplitude of the input signal when the voltage amplitude of the input signal is between the second threshold level and third threshold level;

first switching means coupled to said load, said threshold means and the first voltage level of said voltage means, and responsive to the first threshold signal from said threshold means for switching the first voltage level across said load;

second switching means coupled to said load, said threshold means and the second voltage level of said voltage means, and responsive to the second threshold signal from said threshold means for switching the second voltage level across said load;

third switching means coupled to said load, said threshold means and the third voltage level of said voltage means, and responsive to the third threshold signal from said threshold means for switching the third voltage level across said load; and fourth switching means coupled to said load, said threshold means and the fourth voltage level of said voltage means, and responsive to the fourth threshold signal from said threshold means for switching the fourth voltage level across said load.

18. The class SM amplifier as set forth in claim 17, further having said threshold means responsive to when the voltage amplitude of the input signal is between the second threshold level and the third threshold level, for generating a fifth threshold signal; and fifth switching means coupled to said load, said threshold means and the fifth voltage level of said voltage means, and responsive to the fifth threshold signal from said threshold means for switching the fifth voltage level across said load.

19. A class SM amplifier comprising:
a load;
an input source having an input signal with a bandwidth B and a center frequency $f_o$;
threshold means coupled to said input source and responsive to the input signal, for generating a timing sequence having at least first, second, and third timing intervals;
voltage means for supplying a first voltage level, a second voltage level, and a third voltage level, wherein first voltage level is adjusted to approximate the voltage amplitude of the input signal during the first timing interval, second voltage level is adjusted to approximate the voltage amplitude of the input signal during the second timing interval, and third voltage level is adjusted to approximate the voltage amplitude of the input signal during the third timing interval;
first switching means coupled to said load, said threshold means and the first voltage level of said voltage means, and responsive to the timing sequence signal from said threshold means for switching the first voltage level across said load during the first timing interval; and
second switching means coupled to said load, said threshold means and the second voltage level of said voltage means, and responsive to the timing sequence signal from said threshold means for switching the second voltage level across said load during the second timing interval.

20. The class SM amplifier as set forth in claim 19, further comprising:
third switching means coupled to said load, said threshold means and the third voltage level of said voltage means, and responsive to the timing sequence signal from said threshold means for switching the third voltage level across said load during the third timing interval.

21. A class SM amplifier comprising:
a load;
an input source having an input signal with a bandwidth B and a center frequency $f_o$;
threshold means coupled to said input source and responsive to the input signal, for generating a timing sequence having at least first, second, third, fourth and fifth timing intervals;
voltage means for supplying a first voltage level, a second voltage level, a third voltage level, a fourth voltage level, and a fifth voltage level, wherein first voltage level is adjusted to approximate the voltage amplitude of the input signal during the first timing interval, second voltage level is adjusted to approximate the voltage amplitude of the input signal during the second timing interval, third voltage level is adjusted to approximate the voltage amplitude of the input signal during the third timing interval, fourth voltage level is adjusted to approximate the voltage amplitude of the input signal during the fourth timing interval, and fifth voltage level is adjusted to approximate the voltage amplitude of the input signal during the fifth timing interval;
first switching means coupled to said load, said threshold means and the first voltage level of said voltage means, and responsive to the timing sequence signal from said threshold means for switching the first voltage level across said load during the first timing interval;
second switching means coupled to said load, said threshold means and the second voltage level of said voltage means, and responsive to the timing sequence signal from said threshold means for switching the second voltage level across said load during the second timing interval;
third switching means coupled to said load, said threshold means and the third voltage level of said voltage means, and responsive to the timing sequence signal from said threshold means for switching the third voltage level across said load during the second timing interval; and
fourth switching means coupled to said load, said threshold means and the fourth voltage level of said voltage means, and responsive to the timing sequence signal from said threshold means for switching the fourth voltage level across said load during the fourth timing interval.

22. The class SM amplifier as set forth in claim 21, further comprising:
fifth switching means coupled to said load, said threshold means and the fifth voltage level of said voltage means, and responsive to the timing sequence signal from said threshold means for switching fifth voltage level across said load during the fifth timing interval.

23. The class SM amplifier as set forth in claim 1, further including:
   threshold means having fifth and sixth threshold levels, and responsive to the voltage amplitude input signal crossing fifth and sixth threshold levels, for generating fifth and sixth threshold signals, respectively;
   voltage means for supplying a fifth voltage level, bV, and a sixth voltage level, −bV, wherein fifth voltage level is adjusted to approximate the voltage amplitude of the input signal when the voltage amplitude of the input signal crosses the fifth threshold level, and sixth voltage level is adjusted to approximate to voltage amplitude of the input signal when the voltage amplitude of the input signal crosses the sixth threshold;
   fifth switching means coupled to said load, said threshold means and the fifth voltage level of said voltage means, and responsive to the fifth threshold signal from said threshold means for switching the fifth voltage level across said load; and;
   sixth switching means coupled to said load, said threshold means and the sixth voltage level of said voltage means, and responsive to the sixth threshold signal from said threshold means for switching the sixth voltage level across said load.

24. The class SM amplifier as set forth in claim 4, further including:
   threshold means responsive to the input signal for generating fifth and sixth timing intervals of the timing sequence signal;
   voltage means for supplying a fifth voltage level, bV, and a sixth voltage level, −bV, wherein fifth voltage level is adjusted to approximate the voltage amplitude of the input signal during the fifth timing interval, and sixth voltage level is adjusted to approximate to voltage amplitude of the input signal during the sixth timing interval;
   fifth switching means coupled to said load, said threshold means and the fifth voltage level of said voltage means, and responsive to the timing sequence signal from said threshold means for switching the fifth voltage level across said load during the fifth timing interval; and
   sixth switching means coupled to said load, said threshold means and the sixth voltage level of said voltage means, and responsive to the timing sequence signal from said threshold means for switching the sixth voltage level across said load during the sixth timing interval.

25. A class SM amplifier comprising:
   a load;
   an input source having an input signal with a bandwidth B and a center frequency $f_o$;
   threshold means having first, second, third and fourth threshold levels, and coupled to said input source and responsive to the voltage amplitude of the input signal crossing first, second, third and fourth threshold levels, for generating first, second, third, and fourth threshold signals, respectively;
   voltage means for supplying a first voltage level, V, a second voltage level, aV, a third voltage level, −aV, and a fourth voltage level, −V;
   first switching means coupled to said load, said threshold means and the first voltage level of said voltage means, and responsive to the first threshold signal from said threshold means for switching the first voltage level across said load;
   second switching means coupled to said load, said threshold means and the second voltage level of said voltage means, and responsive to the second threshold signal from said threshold means for switching the second voltage level across said load;
   third switching means coupled to said load, said threshold means and the third level of said voltage means, and responsive to the third threshold signal from said threshold means for switching the third voltage level across said load;
   fourth switching means coupled to said load, said threshold means and the fourth voltage level of said voltage means, and responsive to the fourth threshold signal from said threshold means for switching the fourth voltage level across said load; and
   wherein first and fourth voltage levels, ±V, second and third voltage levels, ±aV, are adjusted to increase efficiency of said class SM amplifier within the bandwidth B at center frequency $f_o$ by having minimal spectral pollution of the input signal amplified outside the bandwidth B and at harmonics of the center frequency $f_o$.

26. The class SM amplifier as set forth in claim 25, further including:
   threshold means having fifth and sixth threshold levels, and responsive to the input signal crossing fifth and sixth threshold levels, for generating fifth and sixth threshold signals, respectively;
   voltage means for supplying a fifth voltage level, bV, and a sixth voltage level, −bV;
   fifth switching means coupled to said load, said threshold means and the fifth voltage level of said voltage means, and responsive to the fifth threshold signal from said threshold means for switching the fifth voltage level across said load;
   sixth switching means coupled to said load, said threshold means and the sixth voltage level of said voltage means, and responsive to the sixth threshold signal from said threshold means for switching the sixth voltage level across said load; and
   wherein fifth and sixth voltage levels, ±bV, are adjusted to increase efficiency of said class SM amplifier by having a significant portion of the input signal amplified within the bandwidth B at center frequency $f_o$ and by having minimal spectral pollution of the input signal amplified outside the bandwidth B and at harmonics of the center frequency $f_o$.

27. A class SM amplifier comprising:
   a load;
   an input source having an input signal with a bandwidth B and a center frequency $f_o$;
   threshold means having at least first and second threshold levels, and coupled to said input source and responsive to the voltage amplitude of the input signal crossing first and second threshold levels, for generating first and second threshold signals, respectively;
   voltage means for supplying at least a first voltage level, a second voltage level, and a third voltage level;
   first switching means coupled to said load, said threshold means and the first voltage level of said voltage means, and responsive to the first threshold signal from said threshold means for switching the first voltage level across said load;

second switching means coupled to said load, said threshold means and the second voltage level of said voltage neans, and responsive to the second threshold signal from said threshold means for switching the second voltage level across said load; and wherein first, second and third voltage levels are adjusted to increase efficiency of said class SM amplifier within the bandwidth B at center frequency $f_o$ by having minimal spectral pollution of the input signal amplified outside the bandwidth B and at harmonics of the center frequency $f_o$.

28. The class SM amplifier as set forth in claim 25, further having said threshold means responsive to when the voltage amplitude of the input signal is between the first threshold level and the second threshold level, for generating a third threshold signal; and third switching means coupled to said load, said threshold means and the third voltage level of said voltage means, and responsive to the third threshold signal from said threshold means for switching the third voltage level across said load.

29. A class SM amplifier comprising:

a load;

an iput source having an input signal with a bandwidth B and a center frequency $f_o$;

threshold means having at least first, second, third and fourth threshold levels, and coupled to said input source and responsive to the voltage amplitude of the input signal crossing first, second, third and fourth threshold levels, for generating first, second, third and fourth threshold signals, respectively;

voltage means for supplying at least a first voltge level, a second voltage level, a third voltage level, a fourth voltage level, and a fifth voltage level;

first switching means coupled to said load, said threshold means and the first voltage level of said voltage means, and responsive to the first threshold signal from said threshold means for switching the first voltage level across said load;

second switching means coupled to said load, said threshold means and the second voltage level of said voltage means, and responsive to the second threshold signal from said threshold means for switching the second voltage level across said load;

third switching means coupled to said load, said threshold means and the third voltage level of said voltage means, and responsive to the third threshold signal from said threshold means for switching the third voltage level across said load;

fourth switching means coupled to said load, said threshold means and the fourth voltage level of said voltage means, and responsive to the fourth threshold signal from said threshold means for switching the fourth voltage level across said load; and wherein first, second, third, fourth, and fifth voltage levels are adjusted to increase efficiency of said class SM amplifier within the bandwidth B at center frequency $f_o$ by having minimal spectral pollution of the input signal amplified outside the bandwidth B and at harmonics of the center frequency $f_o$.

30. The class SM amplifier as set forth in claim 27, further having said threshold means responsive to when the voltage amplitude of the input signal is between the second threshold level and the third threshold level, for generating a fifth threshold signal; and fifth switching means coupled to said load, said threshold means and the fifth voltage level of said voltage means, and responsive to the fifth threshold signal from said threshold means for switching the fifth voltage level across said load.

* * * * *